(12) United States Patent
Morino et al.

(10) Patent No.: US 7,378,887 B2
(45) Date of Patent: May 27, 2008

(54) SEMICONDUCTOR INTEGRATED CIRCUIT WITH POWER-ON STATE STABILIZATION

(75) Inventors: Naozumi Morino, Tokyo (JP); Takahiro Irita, Tokyo (JP); Yasuto Igarashi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/495,735

(22) Filed: Jul. 31, 2006

(65) Prior Publication Data

US 2007/0046342 A1     Mar. 1, 2007

(30) Foreign Application Priority Data

Aug. 31, 2005     (JP)     ............... 2005-251927

(51) Int. Cl.
*H03L 7/00*     (2006.01)
(52) U.S. Cl. .................. 327/143; 327/142; 327/198
(58) Field of Classification Search ................ 327/142, 327/143, 198
See application file for complete search history.

(56) References Cited

U.S. PATENT DOCUMENTS

2006/0062070 A1* 3/2006 Sibigtroth et al. .......... 365/226
2006/0109037 A1* 5/2006 Hsu ........................... 327/143

FOREIGN PATENT DOCUMENTS

JP     2002-111466 A     4/2002
JP     2004-165732 A     6/2004

* cited by examiner

*Primary Examiner*—Charles D. Garber
*Assistant Examiner*—Daniel Rojas
(74) *Attorney, Agent, or Firm*—Miles & Stockbridge, PC

(57) ABSTRACT

The present invention is directed to assure an initial state of a circuit until a power supply voltage is stabilized at the time of power-on and to prevent an output circuit of an external input/output buffer circuit from performing erroneous operation at the time of setting a predetermined register value or the like to an initial value. A power supply detecting circuit outputs a power supply voltage detection signal indicating that a power supply voltage supplied from the outside enters a predetermined state. A power on reset circuit receives the power supply voltage detection signal, instructs an initial setting operation of the internal circuit at a predetermined timing and, in response to completion of the initial setting operation of the internal circuit, changes an external input/output buffer circuit from a high impedance state to an operable state. Consequently, when the external input/output buffer circuit becomes operable, the initial setting of the internal circuit has already completed.

6 Claims, 5 Drawing Sheets

SEMICONDUCTOR INTEGRATED CIRCUIT WITH POWER-ON STATE STABILIZATION

CROSS-REFERENCE TO RELATED APPLICATION

The present application claims priority from Japanese patent application No. 2005-251927 filed on Aug. 31, 2005, the content of which is hereby incorporated by reference into this application.

BACKGROUND OF THE INVENTION

The present invention relates to power on reset in a semiconductor integrated circuit.

Japanese Unexamined Patent Publication No. 2002-111466 describes a technique of providing power on reset circuits corresponding to a plurality of external power supply and determining a timing of cancelling power on reset in an internal circuit by using an AND signal of outputs of the power on reset circuits. In the technique, the power on reset is performed to ensure an initial state of a circuit until power supply voltage reaches a specific voltage at turn-on of an operation power supply. Japanese Unexamined Patent Publication No. 2004-165732 describes an invention of generating a power on reset cancelling timing on the basis of an AND signal between detection signals of an internal voltage detecting circuit and an external voltage detecting circuit.

SUMMARY OF THE INVENTION

The inventors of the present invention have examined a timing of cancelling an initial predetermined state such as a high-level output, a low-level output, and a high impedance state of an output buffer in an external interface circuit at the time of power on reset of a microcomputer. The power on reset is performed to ensure the initial state of a circuit until a power supply voltage reaches a specific voltage at turn-on of an operation power supply and to set a predetermined register value and a predetermined circuit node to specified initial values. For example, when the operation power supply of a microcomputer as a semiconductor integrated circuit is turned on, after lapse of time in which the turned-on operation power supply is stabilized, for example, a system controller provided on a chip controls a reset sequence. According to the reset sequence, the internal state of a CPU (Central Processing Unit) is initialized, and a resister value of a peripheral circuit is initialized. The initializing process of the system controller is performed only on an internal circuit. For an external interface circuit, the initializing process is performed so that the initial state of the circuit can be ensured until the risen operation power supply voltage reaches a specific voltage for an external interface circuit. For example, for an external input/output buffer circuit, the initializing process is performed so that a high impedance state (or a predetermined output state of a high-level output or a low-level output) can be assured. When the timing of cancelling the power on reset is specified from the viewpoint of assuring the initial state of a circuit until the power supply voltage reaches a specific voltage at turn-on of an operation power supply at the time of power on reset, a case is expected such that output operation is enabled by cancellation of the high impedance state of the external input/output buffer circuit and, on the other hand, the initial setting operation by the system controller continues and an operable state is not obtained in an internal circuit. Consequently, during the initial setting operation on the internal circuits by the system controller, the internal state of an internal circuit has not determined, and a signal which is regarded as an instruction of output operation may be erroneously generated and sent to the external input/output buffer circuit. It was found that when the external input/output buffer circuit erroneously performs the outputting operation in response to such an erroneous signal, there is the possibility that an external circuit connected to the external input/output buffer circuit performs erroneous operation or undesired heavy current flows in the external input/output buffer circuit. The techniques disclosed in the patent documents just specify the reset cancelling timing from the viewpoint of ensuring the initial state of a circuit until the risen operation power supply voltage reaches a specific voltage but do not solve the problem recognized by the inventors of the present invention.

An object of the present invention is to provide a semiconductor integrated circuit ensuring an initial state of a circuit until power supply voltage reaches a specific voltage and the state of an internal circuit is stabilized at turn-on of the operation power supply, and eliminating the possibility of erroneous output operation of an external input/output buffer circuit when a predetermined register or the like is set to an initial value.

The above and other objects and novel features of the present invention will become apparent from the description of the specification and the appended drawings.

Outline of representative ones of inventions disclosed in the application will be briefly described as follows.

A semiconductor integrated circuit (1) according to the present invention includes an external terminal, external input/output buffer circuits (7B, 8F), a power supply detecting circuit (8D), a power on reset circuit (8E), and internal circuits (5A, 5B, 5C, 5D). The power supply detecting circuit outputs a power supply voltage detection signal (N3) indicating that a power supply voltage supplied from the outside enters a predetermined state. The power on reset circuit receives the power supply voltage detection signal, instructs an initial setting operation on the internal circuit at a predetermined timing and, in response to completion of the initial setting operation on the internal circuit, sets a predetermined initial state of any of a high-level output, a low-level output, and a high impedance of the external input/output buffer circuit to a state where input/output operation can be performed. With the configuration, by the time the external input/output buffer circuit enters an operable state, the initial settings of the internal circuit have been already completed. Therefore, the possibility that the external input/output buffer circuit performs erroneous output operation due to an undesired signal or noise accompanying the initial setting process during the power on reset process is eliminated.

As one concrete mode of the invention, the power on reset circuit outputs a signal (N4) for ensuring an initial state of a predetermined circuit node until the initial setting operation is instructed to the internal circuit.

As another concrete mode, a first power supply voltage (VCC) is supplied to the external input/output buffer circuit, the power supply detecting circuit, and the power on reset circuit, and a second power supply voltage (VDD) is supplied to the internal circuit. The power supply detecting circuit has a first circuit (8Dvc) for detecting supply of the first power supply voltage and a second circuit (8Dvd) for detecting supply of the second power supply voltage and sets, as the power supply voltage detection signal, an AND signal between a detection result of the first power supply voltage by the first circuit and a detection result of the second power supply voltage by the second circuit. Thus, the initial state of the circuit can be ensured with reliability.

As further another concrete mode, when the power supply detecting circuit detects, after detection of supply of the first power supply voltage and the second power supply voltage, stop of the supply of the second power supply voltage by the second circuit, the external input/output buffer circuit is changed from the operable state to a predetermined state of any of a high-level output, a low-level output, and a high impedance. Consequently, when it becomes impossible to ensure the normal operation of the internal circuit due to stop of the supply of the second power supply voltage, the external input/output buffer circuit can be prevented from performing erroneous output operation.

As further another concrete mode, the internal circuit has a system controller (6A). The system controller receives an instruction of initial setting operation of the internal circuit, receives a clock signal (RTC) from the outside, controls the initial setting operation on the internal circuit synchronously with the received clock signal and, on completion of the initial setting operation, sends an initialization completion signal (N6) to the power on reset circuit.

As further another concrete mode, the internal circuit has a first circuit area (5) to which supply of the second power supply voltage can be selectively stopped in a state where the second power supply voltage is supplied to the power supply terminal, and a second circuit area (6) to which the second power supply voltage is always supplied. The system controller is formed in the second circuit area. In such a manner, the system controller can be prevented from becoming disabled.

As further another concrete mode, an internal power supply switch controller (6B) for controlling whether the second power supply voltage is supplied to the first circuit area or not is provided in the second circuit area. The system controller makes initial setting of the internal power supply switch controller so as to supply the second power supply voltage to the first circuit area in response to an instruction of the initial setting operation from the power on reset circuit. After completion of the power on reset process, any of internal circuits can be ensured to become operable. For example, execution of a boot sequence programming process immediately after the completion can be ensured.

As further another concrete mode, the internal circuit has a central processing unit (5A) and peripheral circuits (5B, 5C, 5D, 6B) of the central processing unit. The system controller initializes an internal state of the central processing unit and sets a predetermined register of the peripheral circuit to an initial value in response to an instruction of the initial setting operation from the power on reset circuit.

Effects obtained by the representative ones of the inventions disclosed in the application will be briefly described as follows. The invention can ensure an initial state of a circuit until power supply voltage reaches a specific voltage and the state of an internal circuit is stabilized at turn-on of the operation power supply, and eliminate the possibility of erroneous output operation of an external input/output buffer circuit when a predetermined register or the like is set to an initial value.

DETAILED DESCRIPTION OF PREFERRED EMBODIMENTS

Figure 1:
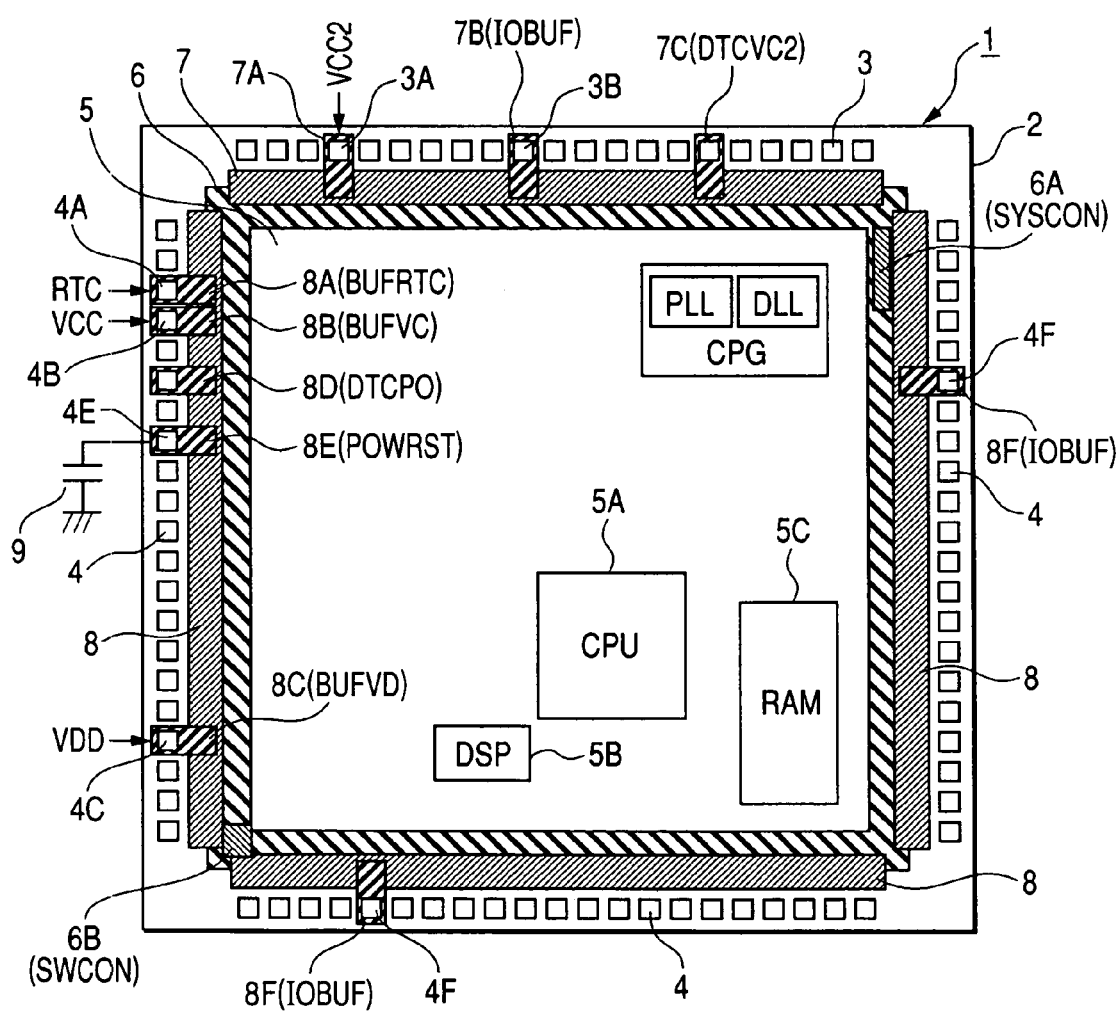
FIG. 1 is a block diagram of a microcomputer to which the present invention is applied.

FIG. 1 illustrates a microcomputer to which the invention is applied. A microcomputer 1 shown in the diagram is formed on a single semiconductor substrate 2 made of single crystal silicon or the like by the complementary MOS integrated circuit technique or the like. A number of bonding pads 3 and 4 as external terminals are disposed in the periphery of the semiconductor substrate.

In a center portion of the semiconductor substrate 2, a first circuit area 5 and a second circuit area 6 on the outside of the first circuit area 5 are provided as internal circuit areas. In the first circuit area 5, a central processing unit (CPU) 5A as an internal circuit is provided and a digital signal processor (DSP) 5B, a random access memory (RAM) 5C, a clock pulse generator (CPG) 5D, and the like are formed as peripheral circuits. The clock pulse generator 5D has a phase locked loop circuit (PLL) and a delay locked loop circuit (DLL) and divides the frequency of a clock signal from the outside, thereby generating an internal clock signal. In the second circuit area 6, a system controller (SYSCON) 6A and an internal power supply switch controller (SWCON) 6B which are representatively shown are disposed. The internal power supply switch controller 6B is positioned as one of peripheral circuits of the central processing unit 5A. The operation power supply voltage of the internal circuit areas 5 and 6 is VDD. The power supply voltage VDD is, for example, 1.2V.

The area between the second circuit area 6 and the bonding pads 3 is an input/output circuit area 7, and the area between the second circuit area 6 and the bonding pads 4 is an input/output circuit area 8. In the input/output circuit area 7, representatively-shown external interface circuits 7A to 7C are formed. The external interface circuits 7A to 7C use external power supply voltage VCC2 as an operation power supply. The external power supply voltage VCC2 is, for example, 3.3V. The external interface circuit 7A is a power supply cell of the external power supply voltage VCC2 and includes a not-shown ESD (electrostatic discharge) protection element, and 3A denotes a power supply pad of the external interface circuit 7A. The external interface circuit 7B is an input/output buffer (IOBUF) representatively shown, and 3B denotes an input/output pad of the external interface circuit 7B. The external interface circuit 7C is a circuit (DCTVC2) for detecting the external power supply voltage VCC2.

In the input/output circuit area 8, representatively-shown external interface circuits 8A to 8F are formed. The external interface circuits 8A to 8F use the external power supply voltage VCC as an operation power supply. The external power supply voltage VCC is, for example, 2.8V. 8A denotes a clock input buffer (BUFRTC) of a clock signal RTC, and 4A denotes a clock input pad of the clock input buffer 8A. 8B denotes a power supply cell (BUFVC) of the external power supply voltage VCC, including a not-shown EDR protection circuit. 4B denotes a power supply pad of the power supply cell 8B. 8C denotes a power supply cell (BUFVD) of the operation power supply voltage VDD of the internal circuit areas 5 and 6, including a not-shown EDS protection circuit. 4C denotes a power supply pad of the power supply cell 8C. 8D denotes a circuit (DTCPO) for detecting the power supply voltages VDD and VCC. 8E denotes a power on reset circuit (POWRST), and 4E denotes a connection pad of a delay element, for example, a capacitative element 9. The external interface circuit 8F denotes a representatively-shown input/output buffer (IOBUF), and 4F denotes an input/output pad of the external interface circuit 8F. The numbers of the external interface circuits 7B and 8F vary according to the configuration of the microcomputer and necessary numbers of the external interface circuits 7B and 8F are prepared for input/output operation.

The central processing unit (CPU) 5A has, although not shown, a command controller for fetching a command, decoding the fetched command, and controlling the procedure for executing the command, and an executer for executing the command on the basis of the control of the command controller. The executer has a computing unit, various registers, and the like, and executes data computation and address computation related to command execution. The digital signal processor 5B executes digital signal process computation in accordance with a DSP command supplied from the CPU 5A, thereby lessening the computation load on the CPU 5A. The digital signal processor 5B has an AND computing unit, various registers, and the like.

In a state where the power supply voltage VDD is supplied to the power supply pad 4C, the internal circuit area 5 is set as a circuit area to which supply of the power supply voltage VDD is stopped, and the second circuit area 6 is set as a circuit area to which the power supply voltage VDD is always supplied. The internal power supply switch controller 6B controls whether the power supply voltage VDD to the circuit area 5 is supplied or not. The system controller 6A controls and monitors the operations of the whole microcomputer such as a reset sequence and a power supply interrupting function using the internal power supply switch controller 6B. The system controller 6A, the internal power supply switch controller 6B, and the like are formed in the second circuit area 6 to which supply of the power supply voltage VDD is always maintained, thereby preventing the system controller 6A, the internal power supply switch controller 6B, and the like from being disabled.

Figure 2:
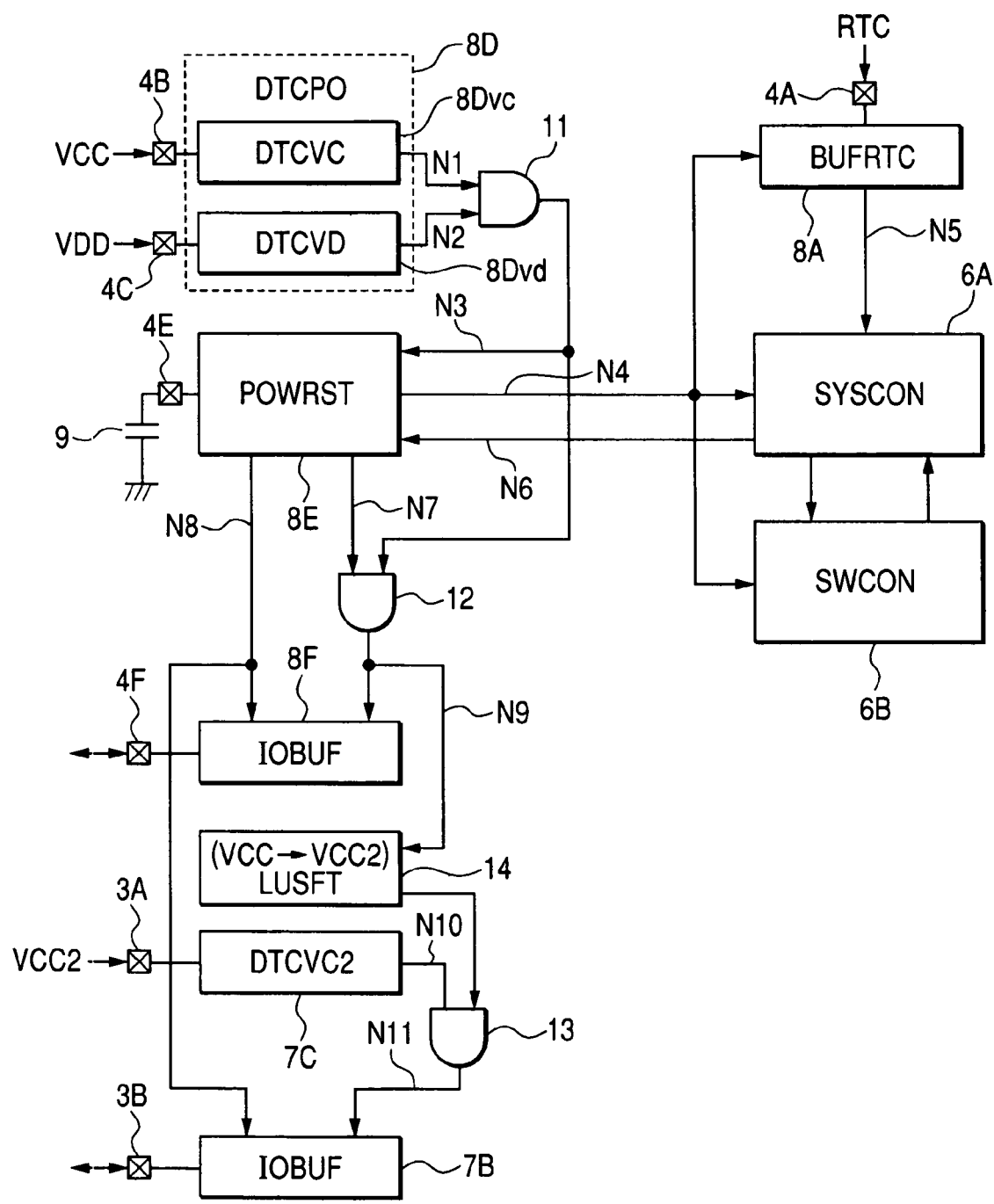
FIG. 2 is a block diagram showing a detailed configuration for power on reset in the microcomputer.

FIG. 2 shows a detailed configuration for power on reset of the microcomputer 1. The microcomputer 1 does not have to receive a reset signal from the outside with power-on. The power supply voltage detecting circuit 8D has a first detection circuit part (DTCVC) 8Dvc for detecting the power supply voltage VCC and a second detection circuit part (DTCVD) 8Dvd for detecting the power supply voltage VDD. When the supplied power supply voltage becomes a specified voltage, the detection circuit parts 8Dvc and 8Dvd change detection signals N1 and N2 to the high level. The detection signals N1 and N2 are supplied to an AND gate 11 where an AND signal is generated. The AND signal is used as a power supply voltage detection signal N3. The power on reset circuit 8E receives the power supply voltage detection signal N3 and, when the power supply voltage detection signal N3 is changed to the high level, after lapse of delay time according to a time constant determined by the capacitance value of the capacitative element 9, the power on reset circuit 8E sets the signal N4 to the high level. Although not shown, the signal N4 is supplied to various circuits in the microcomputer 1. In the period in which the signal N4 is at the low level, in a state where the operation power supply started to be supplied is not stabilized yet, the levels of predetermined nodes of various circuits are controlled so as to ensure the initial state of the predetermined nodes of the various circuits. By inverting the low level of the signal N4 to the high level, the function of ensuring the initial state of the nodes by the signal N4 is cancelled. In short, in view of ensuring the initial state of a predetermined node, the reset operation is cancelled.

The power on reset process in the microcomputer 1 is not completed by the above operations. The signal N4 is supplied to the system controller 6A. By the control of the system controller 6A, initial setting of the CPU 5A and the peripheral circuits is performed. Specifically, the system controller 6A recognizes the change of the signal N4 to the high level as an instruction of the initial setting operation. In response to the recognition, the system controller 6A makes initial setting on the internal state of the CPU 5A, and performs an operation of setting the control registers of the peripheral circuits such as the clock pulse generator 5D, the digital signal processor 5B, and the internal power supply switch controller 6B to initial values. The operation is performed synchronously with the clock signal RTC. The clock signal RTC can be supplied from the clock input buffer 8A in response to the high level of the signal N4. The clock signal RTC is a clock signal of, for example, 32 kHz. In the initial setting of the internal power supply switch controller 6B, the control register is initialized so as to select supply of the power supply voltage VDD to the circuit area 5 in order to assure that any of internal circuits becomes operable after completion of the power on reset process. In short, the supply of the power supply voltage VDD is selected so that a programming process such as boot sequence can be performed immediately after that.

After completion of initialization such as the initial setting for the internal state of the CPU 5A and the control register of the peripheral circuits, the system controller 6A changes to a signal N6 to the high level and sends the high-level signal N6 to the power on reset circuit 8E. In response to the high level of the signal N6, the power on reset circuit 8E changes signals N7 and N8 to the high level. An AND gate 12 computes the AND between the signals N7 and N3, thereby generating an AND signal N9. By the signals N8 and N9, whether fixing of the input/output state of the input/output buffer 8F disposed in the input/output circuit region 8 is set or cancelled is controlled. For example, when the signals N8 and N7 are at the low level, an output to the outside of the input/output buffer 8F is fixed at a high impedance and an output to the inside is fixed at the low level. When the signals N8 and N7 are set to the high level, the input/output buffer 8F is allowed to perform the output/input operations in accordance with an instruction from an internal circuit. For example, the initial output state expected according to the configuration of the terminal and an external device to which the input/output buffer 8F is connected is not necessarily the high impedance state. The output state may be a high-level output or a low-level output.

Figure 3:
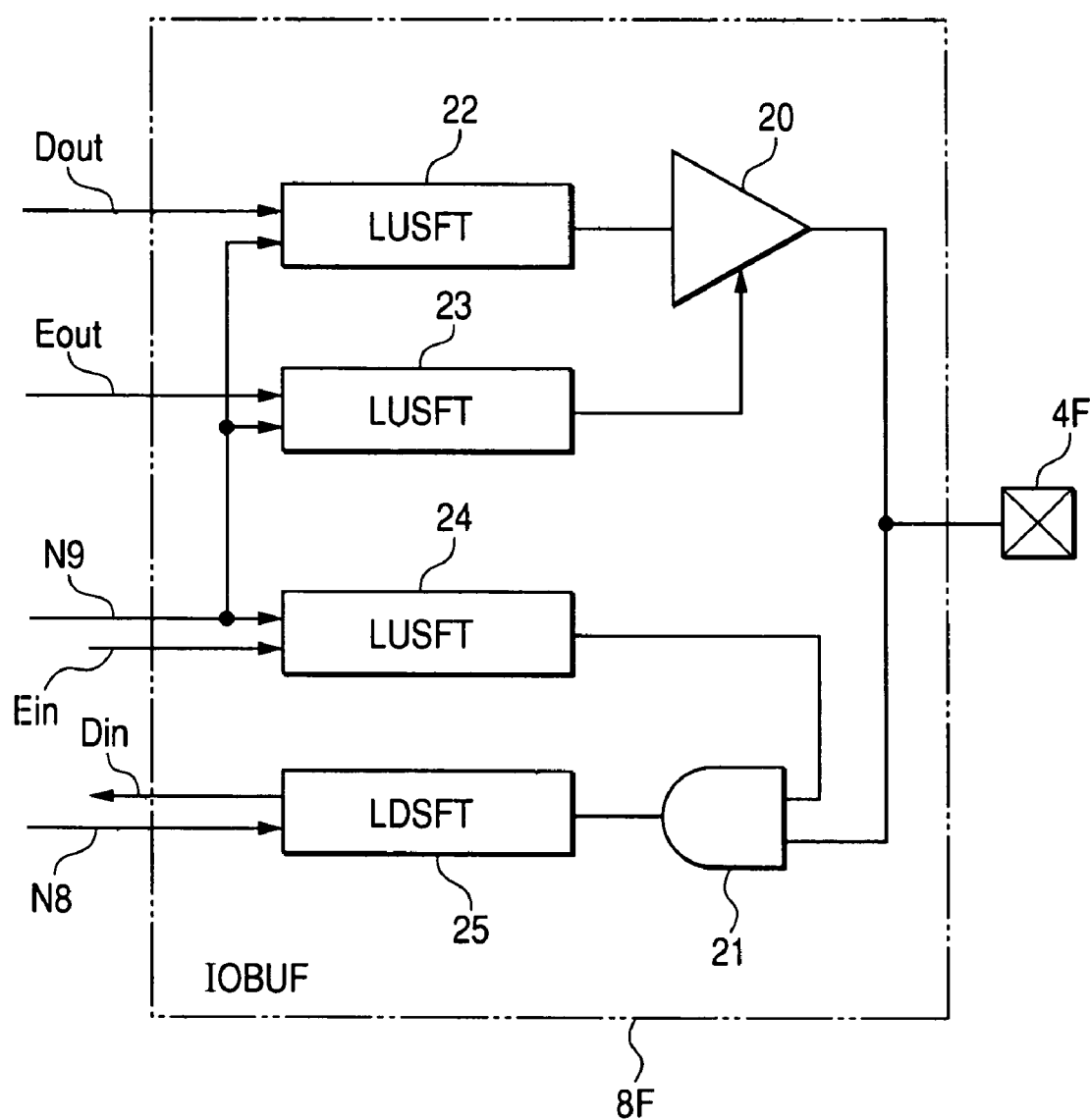
FIG. 3 is a block diagram showing an example of an input/output buffer.

A configuration for enabling fixing of the input/output state of the input/output buffer 8F to be set or cancelled will be described. FIG. 3 shows an example of the input/output buffer 8F. The input/output buffer 8F has an output circuit 20 and an input circuit 21 sharing the input/output pad 4F, level-up shifters 22 to 24, and a level-down shifter 25. Each of the level-up shifters 22 to 24 is a circuit for increasing the signal amplitude of 1.2V of an input to the signal amplitude of 2.8V. When a signal N9 is at the low level, outputs of the level-up shifters 22 to 24 are fixed to the low level. When the signal N9 is at the high level, an operation of increasing the signal amplitude is enabled. The level-down shifter 25 is a circuit for decreasing the signal amplitude of 2.8V of an input to the signal amplitude of 1.2V. When the signal N8 is at the low level, an output of the level-down shifter 25 is fixed to the low level. When the signal N9 is at the high level, an operation of decreasing the signal amplitude is enabled. The output circuit 20 takes the form of a tristate buffer, and the input circuit 21 takes the form of an AND gate. When a tristate control terminal of the output circuit 20 which receives an output of the level-up shifter 23 is at the low level, the output circuit 20 is set in a high output impedance state. When the tristate control terminal is at the high level, the input/output operation of the output circuit 20 is enabled. When an output of the level-up shifter 24, which is received by one of input terminals of the input circuit 21 is at the low level, an output of the input circuit 21 is fixed at the low level. When an output of the level-up shifter 24 is at the high level, an input of the input circuit 21 is transmitted as an output. Therefore, when the signals N8 and N7 are at the low level, the input/output pad 4F is fixed to have a high impedance, and input data Din is fixed at the low level. In other words, the output circuit 20 is set in a high impedance state, and the output of the input circuit 21 is fixed at the low level. This state is the fixed input/output state. When the signals N8 and N7 are set to the high level, output of data Dout is enabled in response to the high level of an output enable signal Eout, the output is disabled in response to the low level of the output enable signal Eout, data of the pad 4F can be received as data Din in response to the high level of an input enable signal Ein, and the receiving operation is disabled in response to the low level of the input enable signal Ein.

Whether the input/output state of the input/output buffer 7B disposed in the input/output circuit area 7 is fixed or not is also controlled on the basis of the signals N8 and N9. An AND gate 13 computes the AND between the signal N9 and a signal N10 which is set to the high level when stabilization of the external power supply voltage VCC2 is detected by the power supply voltage detecting circuit 7C. An AND signal N11 and the signal N8 are used to control whether fixing of the input/output state of the input/output buffer 7B is set or cancelled. The input/output buffer 7B may have a basic configuration as shown in FIG. 3 although the signal amplitudes of the level-up shifters and the level-down shifter are different from those of FIG. 3. In a path extending from the output N9 of the AND gate 12 to one of inputs of the AND gate 13, a level-up shifter (LUSFT) 14 is shown. The level-up shifter 14 is a circuit for increasing the signal amplitude of 2.8V to the signal amplitude of 3.3V on the basis of the fact that the operation power supply voltage VCC2 of the input/output circuit region 7 is higher than VCC. It is to be understood that the level-up shifter 14 is a circuit which is disposed in correspondence with one of input terminals of the AND gate 13 but is shown as a circuit provided on the outside. Therefore, necessary level-up and level-down shifters are disposed in correspondence with input and output terminals for also the power on reset circuit 8E and the like.

Figure 4:
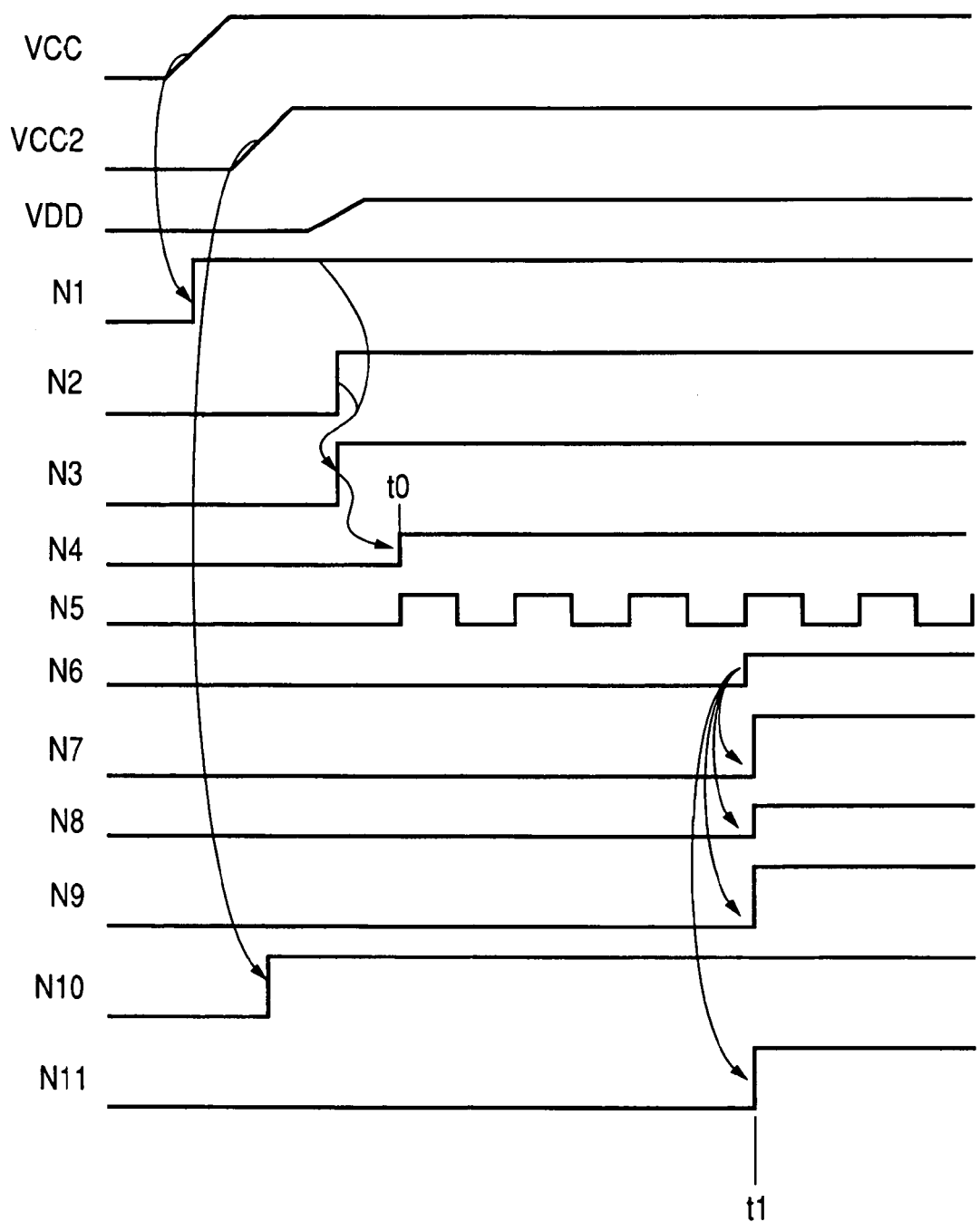
FIG. 4 is a timing chart of power on resetting operation in the microcomputer.

FIG. 4 shows a timing chart of the power on reset operation. In FIG. 4, the operation power supply voltages rise in order of VCC, VCC2, and VDD, and their rise speeds are different from each other. For the period from power-on to time t0 after the levels of all of power supply which are turned on are stabilized, the initial states of predetermined nodes of various circuits in the microcomputer 1 are assured by the low level of the signal N4. When the function of assuring the initial state of the nodes by the signal N4 is cancelled after the time t0, the CPU 5A is initialized by the system controller 6A and the initial value of the control register of the peripheral circuit is set, and the operations complete at time t1. Although not shown, after that, the CPU 5A fetches a reset vector and executes a reset exception process and the like.

Figure 5:
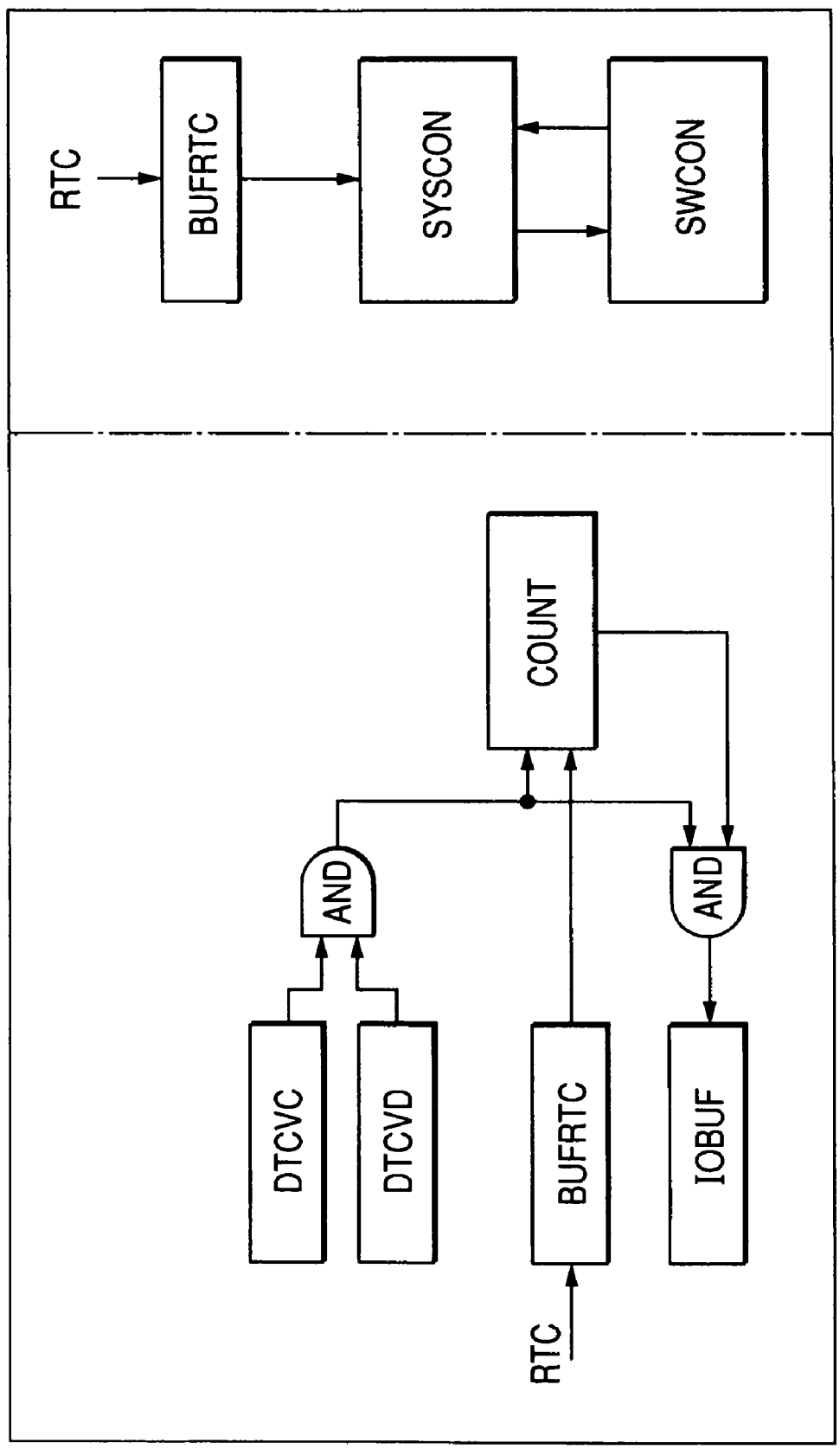
FIG. 5 is a diagram showing a comparative example in which initial setting by a system controller and control of enabling the input/output buffer are separated from each other.

With the power on reset circuit configuration, by the time the input/output buffers 8F and 7B become operable, initialization of the internal circuits such as the CPU 5A in the circuit region 5 has already been completed by the system controller 6A. Therefore, the possibility that the input/output buffers 8F and 7B perform erroneous operation due to undesired signal and noise from the circuit area 5 accompanying the initializing process during the power on reset process can be eliminated. The invention will be compared with a comparative example of FIG. 5. In the comparative example, initialization of the CPU and peripheral circuits performed by the system controller (SYSCON) is started synchronously with an RTC clock from the outside, and an input/output buffer (IOBUF) is enabled synchronously with a timing of counting-up the clock RTC of the counter (COUNT) after rise of the power supply voltage. In the comparative example, there is a case such that the initialization of the internal circuits such as the CPU has not been finished at the time the operation of the input/output buffer is enabled depending on the setting of a count-up value of the counter (COUNT), power-on timing, power rise speed, timing of supplying the RTC clock, and the like. In the present invention, such a situation does not occur.

Since the power on reset circuit (POWRST) 8E operates on the power supply voltage VCC, the power supply voltage VCC has to be supplied first. After the power supply voltage VCC is supplied, the above-described effect can be assured irrespective of the order of turn-on of the power supply voltages VCC2 and VDD and other plural power supply voltages such as VCC3 and VCC4 of different power supply potentials and irrespective of rise speed. Assurance of the initial state of the circuit nodes at the time of power supply rise, initialization by the system controller, and control of enabling the input/output buffer in the high impedance state are controlled sequentially.

Further, the signal N9 is the AND signal between the signals N7 and N3. When supply of the operation power supply voltage VDD from the power supply terminal 4C is stopped in a state where the supply of the power supply VCC from the terminal 4B is maintained, the signal N9 is immediately changed to the low level. In response to the change, the output circuit 20 of the input/output buffer 8F is set to the high impedance state. Therefore, erroneous outputting operation of the input/output buffer 8F caused when it becomes unable to ensure the normal operation of an internal circuit such as the CPU 5A due to stop of the supply of the power supply voltage VDD can be suppressed.

The present invention achieved by the inventors herein has been described concretely above on the basis of the embodiments. Obviously, the invention is not limited to the embodiments but can be variously modified without departing from the gist of the invention.

For example, the supply of the operation power supply to the internal circuit may not be selectively stopped. The control of selective stop of supply of the power supply may be performed by a circuit module itself such as a CPU or DSP by using the internal power supply switch controller. The on-chip circuit module is not limited to a CPU, DSP, or the like but can be properly changed. The configuration of the input/output buffer is not limited to that of FIG. 3 but may be another push-pull configuration, an open drain configuration, or the like. The invention can be applied not only to a microcomputer but also to various semiconductor integrated circuits of other data processors, storages, drivers, and the like.

What is claimed is:

1. A semiconductor integrated circuit comprising:
an external terminal;
an external input/output buffer circuit;
a power on reset circuit; and
an internal circuit,
wherein the power supply detecting circuit outputs a power supply voltage detection signal indicating that a power supply voltage supplied from the outside enters a predetermined state,
wherein the power on reset circuit receives the power supply voltage detection signal, instructs an initial setting operation on the internal circuit at a predetermined timing and, in response to completion of the initial setting operation on the internal circuit, sets a predetermined initial state of any of a high-level output, a low-level output, and a high impedance of the external input/output buffer circuit to a state where input/output operation can be performed,
wherein the power on reset circuit outputs a signal for ensuring an initial state of a predetermined circuit node until the initial setting operation is instructed to the internal circuit,
wherein a first power supply voltage is supplied to the external input/output buffer circuit, the power supply detecting circuit, and the power on reset circuit, and a second power supply voltage is supplied to the internal circuit, and
wherein the power supply detecting circuit has a first circuit for detecting supply of the first power supply voltage and a second circuit for detecting supply of the second power supply voltage and sets, as the power supply voltage detection signal, an AND signal between a detection result of the first power supply voltage by the first circuit and a detection result of the second power supply voltage by the second circuit.

2. The semiconductor integrated circuit according to claim 1,
wherein when the power supply detecting circuit detects, after detection of supply of the first power supply voltage and the second power supply voltage, stop of the supply of the second power supply voltage by the second circuit, the external input/output buffer circuit is changed from the operable state to a predetermined state of any of a high-level output, a low-level output, and a high impedance.

3. The semiconductor integrated circuit according to claim 2,
wherein the internal circuit has a system controller, and
wherein the system controller receives an instruction of initial setting operation of the internal circuit, receives a clock signal from the outside, controls the initial setting operation of the internal circuit synchronously with the received clock signal and, on completion of the initial setting operation, sends an initialization completion signal to the power on reset circuit.

4. The semiconductor integrated circuit according to claim 3,
wherein the internal circuit has a first circuit area to which supply of the second power supply voltage can be selectively stopped in a state where the second power supply voltage is supplied to the power supply terminal, and a second circuit area to which the second power supply voltage is always supplied, and
wherein the system controller is formed in the second circuit area.

5. The semiconductor integrated circuit according to claim 4,
wherein an internal power supply switch controller for controlling whether the second power supply voltage is supplied to the first circuit area or not is provided in the second circuit area, and
wherein the system controller makes initial setting of the internal power supply switch controller so as to supply the second power supply voltage to the first circuit area in response to an instruction of the initial setting operation from the power on reset circuit.

6. The semiconductor integrated circuit according to claim 5,
wherein the internal circuit has a central processing unit and a peripheral circuit, and
wherein the system controller initializes an internal state of the central processing unit and sets a predetermined register of the peripheral circuit to an initial value in response to an instruction of the initial setting operation from the power on reset circuit.

* * * * *